United States Patent
Kuo et al.

(10) Patent No.: US 9,093,332 B2
(45) Date of Patent: Jul. 28, 2015

(54) ELONGATED BUMP STRUCTURE FOR SEMICONDUCTOR DEVICES

(75) Inventors: Tin-Hao Kuo, Hsin-Chu (TW); Yu-Feng Chen, Hsin-Chu (TW); Chen-Shien Chen, Zhubei (TW); Chen-Hua Yu, Hsin-Chu (TW); Sheng-Yu Wu, Hsin-Chu (TW); Chita Chuang, Kaohsiung (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 968 days.

(21) Appl. No.: 13/023,011

(22) Filed: Feb. 8, 2011

(65) Prior Publication Data

US 2012/0199966 A1   Aug. 9, 2012

(51) Int. Cl.
*H01L 23/48* (2006.01)
*H01L 23/00* (2006.01)
*H01L 23/31* (2006.01)

(52) U.S. Cl.
CPC ............ *H01L 24/13* (2013.01); *H01L 23/3192* (2013.01); *H01L 24/14* (2013.01); *H01L 24/05* (2013.01); *H01L 2224/05555* (2013.01); *H01L 2224/05572* (2013.01); *H01L 2224/05647* (2013.01); *H01L 2224/05666* (2013.01); *H01L 2224/05681* (2013.01); *H01L 2224/05687* (2013.01); *H01L 2224/1145* (2013.01); *H01L 2224/11452* (2013.01); *H01L 2224/131* (2013.01); *H01L 2224/13012* (2013.01); *H01L 2224/13014* (2013.01); *H01L 2224/13022* (2013.01); *H01L 2224/13027* (2013.01); *H01L 2224/13083* (2013.01); *H01L 2224/13111* (2013.01); *H01L 2224/13116* (2013.01); *H01L 2224/13124* (2013.01); *H01L 2224/13139* (2013.01); *H01L 2224/13144* (2013.01); *H01L 2224/13147* (2013.01); *H01L 2224/13155* (2013.01); *H01L 2224/13169* (2013.01); *H01L 2224/14141* (2013.01); *H01L 2224/81192* (2013.01); *H01L 2924/00013* (2013.01); *H01L 2924/014* (2013.01); *H01L 2924/01013* (2013.01); *H01L 2924/01019* (2013.01); *H01L 2924/01029* (2013.01); *H01L 2924/01033* (2013.01); *H01L 2924/01047* (2013.01);
(Continued)

(58) Field of Classification Search
None
See application file for complete search history.

(56) References Cited

U.S. PATENT DOCUMENTS 5,773,888 A * 6/1998 Hosomi et al. ............... 257/737
5,859,474 A   1/1999 Dordi
(Continued)

FOREIGN PATENT DOCUMENTS

CN   1054237    7/2000
CN   101764116  6/2010
(Continued)

*Primary Examiner* — Marvin Payen
(74) *Attorney, Agent, or Firm* — Slater & Matsil, L.L.P.

(57) ABSTRACT

An elongated bump structure for semiconductor devices is provided. An uppermost protective layer has an opening formed therethrough. A pillar is formed within the opening and extending over at least a portion of the uppermost protective layer. The portion extending over the uppermost protective layer exhibits a generally elongated shape. In an embodiment, the position of the opening relative to the portion of the bump structure extending over the uppermost protective layer is such that a ratio of a distance from an edge of the opening to an edge of the bump is greater than or equal to about 0.2. In another embodiment, the position of the opening is offset relative to center of the bump.

20 Claims, 7 Drawing Sheets

(52) U.S. Cl.
CPC ............... *H01L2924/01073* (2013.01); *H01L 2924/01078* (2013.01); *H01L 2924/01079* (2013.01); *H01L 2924/01082* (2013.01)

(56) References Cited

U.S. PATENT DOCUMENTS

| | | |
|---|---|---|
| 6,037,547 A | 3/2000 | Blish, II |
| 8,047,421 B2 | 11/2011 | Sri-Jayantha et al. |
| 2002/0179689 A1 | 12/2002 | Tung |
| 2011/0297995 A1* | 12/2011 | Akimoto et al. ............... 257/99 |
| 2012/0098120 A1 | 4/2012 | Yu et al. |

FOREIGN PATENT DOCUMENTS

| | | |
|---|---|---|
| JP | 2002/208665 A | 7/2000 |
| JP | 2004/259888 A | 9/2004 |

* cited by examiner

ELONGATED BUMP STRUCTURE FOR SEMICONDUCTOR DEVICES

BACKGROUND

Generally, semiconductor dies comprise active devices, metallization layers forming connections to the active devices, and I/O contacts to provide the metallization layers (and active devices) signals and power. The metallization layers generally comprise a series of dielectric layers and metal layers in order to provide all of the required connections between the active devices and the I/O contacts (and between individual active devices). These dielectric layers may be formed from low-k dielectric materials with dielectric constants (k value) between about 2.9 and 3.8, ultra low-k (ULK) dielectric materials, with k values less than about 2.5, or even extra low-k (ELK) dielectric materials with k values between about 2.5 and about 2.9, or some combination of low-k dielectric materials.

However, while these low-k, ULK, and ELK materials may be used to improve the electrical characteristics of the metallization layers and thereby increase the overall speed or efficiency of the semiconductor device, these materials may also exhibit structural deficiencies. For example, some of these materials may have greater trouble than other dielectric materials handling the stresses applied to them in the semiconductor device. As such, the low-k, ULK, and ELK materials tend to delaminate or crack when too much pressure is applied to the low-K, ELK, and ULK materials, thereby damaging or destroying the semiconductor device and reducing yields and increasing costs.

These delamination issues related to stress can be particularly troublesome when using packaging techniques such as surface-mount technology (SMT) and flip-chip packaging. As opposed to more conventional packaged ICs that have a structure basically interconnected by fine gold wire between metal pads on the die and electrodes spreading out of molded resin packages, these packaging techniques rely on bumps of solder to provide an electrical connection between contacts on the die and contacts on a substrate, such as a packaging substrate, a printed circuit board (PCB), another die/wafer, or the like. The different layers making up the interconnection typically have different coefficients of thermal expansion (CTEs). As a result, additional stress derived from this difference is exhibited on the joint area, which also may cause cracks to form and/or delamination.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION

Figure 1:
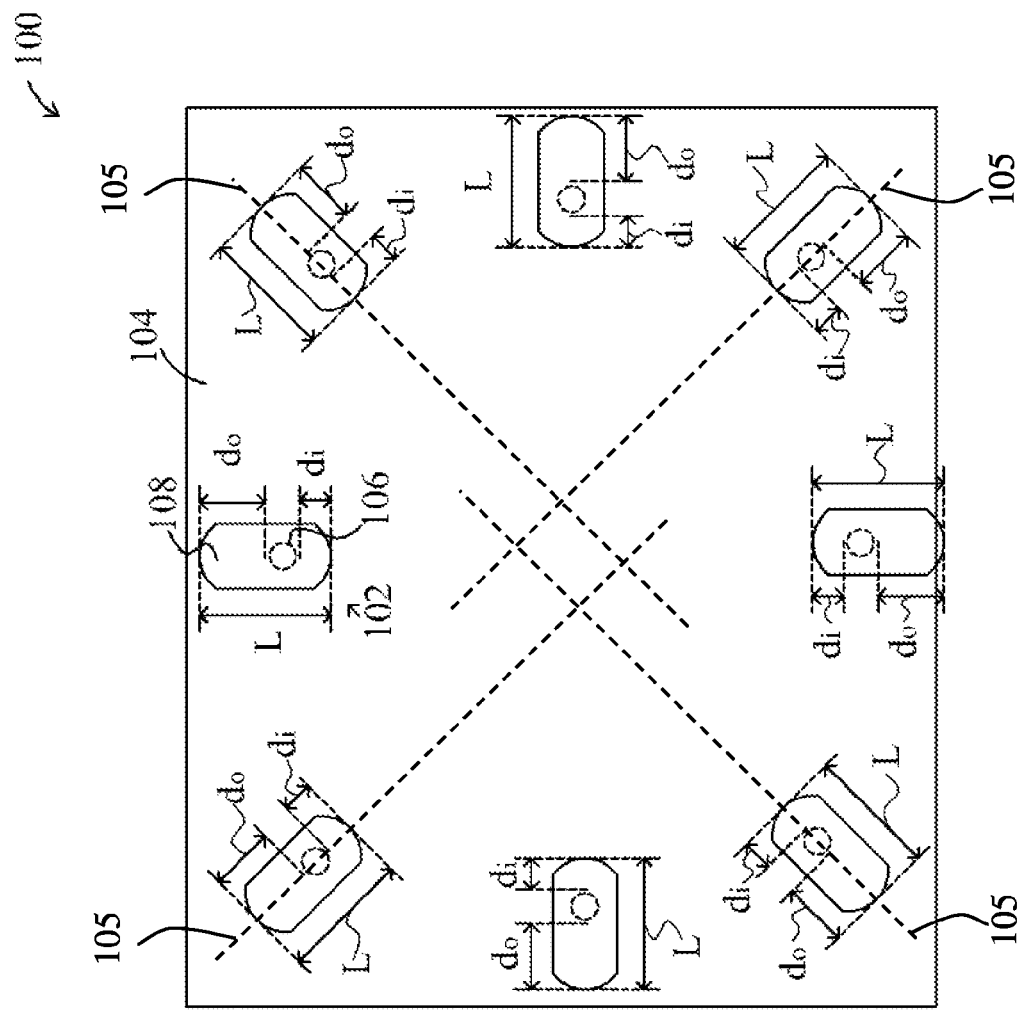
FIG. 1 is a plan view of contact bumps and openings of a semiconductor device in accordance with an embodiment.

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative of specific ways to make and use the embodiments, and do not limit the scope of the disclosure.

Embodiments described herein relate to the use of bump structures with semiconductor devices. As will be discussed below, embodiments are disclosed that utilize a bump structure for the purpose of attaching one substrate to another substrate, wherein each substrate may be a die, wafer, printed circuit board, packaging substrate, or the like, thereby allowing for die-to-die, wafer-to-die, wafer-to-wafer, die or wafer to printed circuit board or packaging substrate, or the like. Throughout the various views and illustrative embodiments, like reference numerals are used to designate like elements.

FIG. 1 is a plan view of a portion of a substrate 100 having external contacts 102 formed thereon in accordance with an embodiment. The exterior surface of the substrate 100 is covered with a protective layer 104, such as a polyimide layer, to protect the substrate from environmental contaminants or to act as a stress buffer layer for the substrate 100. Within the protective layer 104 are shown openings 106. Also shown in FIG. 1 is an outline for elongated bumps 108 that encompass respective openings 106. The elongated bumps 108 may be, for example, a copper or other conductive material pillar structure, a pillar structure with solder, and/or the like, extending through the openings 106 to provide an electrical connection to the underlying conductive pad (not shown). The elongated bumps 108 may subsequently be connected to another substrate, such as a die, wafer, printed circuit board, packaging substrate, or the like. The relationship of the openings 106 and the elongated bumps 108 are described in greater detail below with reference to FIG. 2.

It should be noted that the various embodiments disclosed herein are described with reference to bump structures located along a chip edge or corner for illustrative purposes only. Other embodiments may utilize aspects with bump structures along interior portions of the chip. It should also be noted that the placement of the bump structures are provided for illustrative purposes only and that the specific locations and patterns of the bump structures may vary and may include, for example, an array of bumps, lines of bumps in a middle region of the chip, staggered bumps, and/or the like. The illustrated chip and bump sizes are provided for reference only and are not intended to be actual sizes or actual relative sizes. In some embodiments, a longitudinal axis (e.g., longitudinal axes 105 as illustrated in FIG. 1) of a first bump structure in a first corner of the substrate intersect a longitudinal axis of another bump structure located in a second corner, wherein the first corner and the second corner sharing a common side of the substrate. In some embodiments, at least two of the bump structures extending along a same edge of the substrate have longitudinal axis that intersect in a central region of the substrate.

Figure 2:
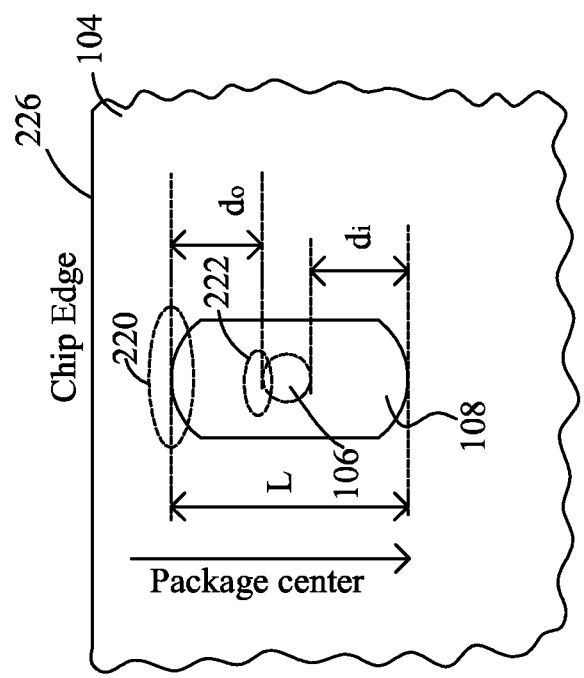
FIG. 2 is an enlarged view of an external contact in accordance with an embodiment.

FIG. 2 is an enlarged view of the external contact 102 illustrated in FIG. 1 in accordance with an embodiment. Generally, the external contact 102 includes elongated bumps 108 having an elongated shape with a length L. The openings 106 within the protective layer 104 are positioned according to the following equation.

$$\frac{d_o}{L} \geq 0.2, \quad \text{(Eq. 1)}$$

wherein:
 $d_o$ represents an outer distance from the opening 106 to an edge of the respective elongated bump 108; and
 L represents a length of the elongated bump 108.

Furthermore, in some embodiments, the outer distance $d_o$ is greater than or equal to an internal distance $d_i$, wherein internal distance $d_i$ is the distance from an edge of the opening 106 to an edge of the elongated bump 108 along the longitudinal axis of the elongated bump 108 It has been found that embodiments such as these may significantly reduce stress and, hence, risk of delamination. In particular, embodiments such as those disclosed herein may reduce the stress located at least at an edge of the elongated bump 108 (the region indicated by reference numeral 220) and an edge of the opening 106 in the protective layer 104 (the region indicated by reference numeral 222).

In the embodiments illustrated herein, the elongated bumps 108 are arranged such that the outer distance $d_o$, which is generally the larger than the internal distance $d_i$, is on the side of the opening 106 facing a chip edge 226, because the amount of stress is typically greater along the chip edges and/or corners. In some embodiments, however, it may be possible that the stress is greater along a different direction. In these embodiments, it may be desirable to orient the elongated bumps 108 and the openings 106 such that the greater outer distance $d_o$ is facing the higher stress region.

Figure 3:
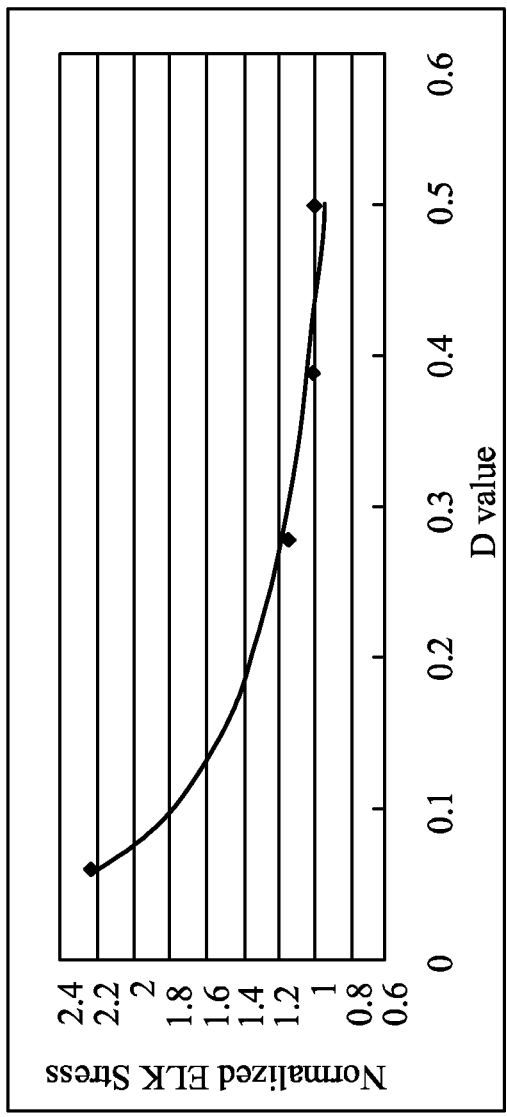
FIG. 3 is a plot indicating a reduction of stress in accordance with an embodiment.

FIG. 3 illustrates results that may be obtained by embodiments such as those discussed herein. As illustrated in FIG. 3, the stress, such as stress located at region 220 and/or region 222, is reduced as the ratio of Equation 1 is increased. In particular, the normalized stress may be reduced from 2.2 to less than 1.4 by maintaining the ratio of Equation 1 greater than about 0.2. Increasing the ratio of Equation 1 to greater values, e.g., 0.3-0.5, may further reduce the stress.

Figure 4:
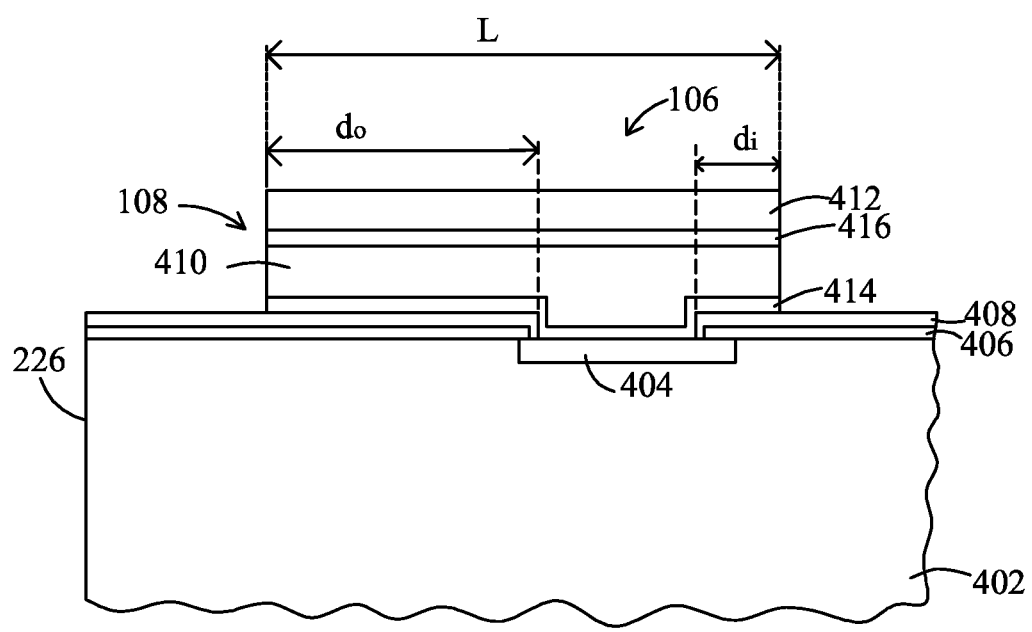
FIG. 4 is a cross-sectional view of an external contact in accordance with an embodiment.

FIG. 4 is a cross-sectional view of the external contact 102 in accordance with an embodiment. A portion of a substrate 402 having electrical circuitry (not shown) and a contact pad 404 formed thereon is shown. The substrate 402 may comprise, for example, bulk silicon, doped or undoped, or an active layer of a semiconductor-on-insulator (SOI) substrate, and the electrical circuitry may include any type of circuitry suitable for a particular application. In an embodiment, the electrical circuitry includes electrical devices formed on the substrate 402 with one or more dielectric layers overlying the electrical devices. Metal layers may be formed between dielectric layers to route electrical signals between the electrical devices. Electrical devices may also be formed in one or more dielectric layers. The one or more dielectric layers may include low-k, ULK, and/or ELK materials.

Contact pads 404 are provided in the uppermost dielectric layer to provide external electrical connections. One or more passivation layers, such as passivation layer 406, are formed and patterned over the contact pads 404 as illustrated in FIG. 4. The passivation layer 406 may be formed of a dielectric material, such as PE-USG, PE-SiN, combinations thereof, and/or the like, by any suitable method, such as CVD, PVD, or the like. In an embodiment, the passivation layer 406 has a thickness of about 10,000 Å to about 15,000 Å. In an embodiment, the passivation layer 406 comprises a multi-layer structure of 750 Å of SiN, 6,500 Å of PE-USG, and 6,000 Å of PE-SiN.

A protective layer 408 formed and patterned over the passivation layer 406. The protective layer 408 may be, for example, a polyimide material formed by any suitable process, such as spin coating of photo resister, or the like. In an embodiment, the protective layer 408 has a thickness between about 2.5 μm and about 10 μm.

Thereafter, a bump structure, such as the elongated bump 108, may be formed, thereby providing an electrical contact to the contact pads 404. In an embodiment, the elongated bump 108 includes a conductive pillar 410 and solder material 412. The conductive pillar 410 may be formed, for example, by depositing a conformal seed layer, forming a patterned mask (e.g., a patterned photoresist mask, hard mask, a combination thereof, or the like) over the conformal seed layer 414 wherein openings in the patterned mask defines the desired shape of the conductive pillar 410, and forming the conductive pillar 410 within the opening of the patterned mask. The seed layer 414 is a thin layer of a conductive material that aids in the formation of a thicker layer during subsequent processing steps. In an embodiment, the seed layer 414 may be formed by depositing a thin conductive layer, such as a thin layer of Cu, Ti, Ta, TiN, TaN, combinations thereof, or the like, using CVD or physical vapor deposition (PVD) techniques. For example, a layer of Ti is deposited by a PVD process to form a barrier film and a layer of Cu is deposited by a PVD process to form the seed layer 414.

The conductive pillar 410 may be formed of any suitable conductive material, including Cu, Ni, Pt, Al, combinations thereof, or the like, and may be formed through any number of suitable techniques, including PVD, CVD, electrochemical deposition (ECD), molecular beam epitaxy (MBE), atomic layer deposition (ALD), electroplating, and the like. In an embodiment, the conductive pillar 410 has a thickness between about 20 μm and about 50 μm.

Optionally, a conductive cap layer, such as conductive cap layer 416 illustrated in FIG. 4, may be formed over the conductive pillar 410. During the soldering process, an intermetallic compound (IMC) layer (not shown) may be naturally formed at the joint between the solder material and the underlying surface. It has been found that some materials may create a stronger, more durable IMC layer than others. As such, it may be desirable to form a cap layer, such as the conductive cap layer 416, to provide an IMC layer having more desirable characteristics. For example, in an embodiment in which the conductive pillar 410 is formed of copper, a conductive cap layer 416 formed of nickel may be desirable. Other materials, such as Pt, Au, Ag, combinations thereof, or the like, may also be used. The conductive cap layer 416 may be formed through any number of suitable techniques, including PVD, CVD, ECD, MBE, ALD, electroplating, and the like.

The solder material 412 is formed over the conductive pillar 410 and/or the conductive cap layer 416. In an embodiment, the solder material 412 comprises SnPb, a high-Pb material, a Sn-based solder, a lead-free solder, or other suitable conductive material.

As discussed above, in an embodiment the dimensions and placement of the conductive pillar 410 relative to the opening 106 is such that a ratio of the outer distance $d_o$ to the length of the elongated bump structure L is greater than or equal to 0.2.

Thereafter, other back-end-of-line (BEOL) processing techniques, including a solder reflow process, suitable for the particular application may be performed. For example, an encapsulant may be formed, a singulation process may be performed to singulate individual dies, wafer-level or die-level stacking, and the like, may be performed. It should be noted, however, that embodiments may be used in many different situations. For example, embodiments may be used in a die-to-die bonding configuration, a die-to-wafer bonding configuration, a wafer-to-wafer bonding configuration, die-level packaging, wafer-level packaging, or the like.

It should also be noted that other embodiments may not place the solder material 412 on the conductive pillars 410 prior to attaching the substrate 402 to another substrate (not shown). In these other embodiments, the solder material 412 may be placed on the other substrate and then the conductive pillars 410 on the substrate 402 are brought into contact with the solder material on the other substrate and a reflow process is performed to solder the two substrates together.

Figure 5C:
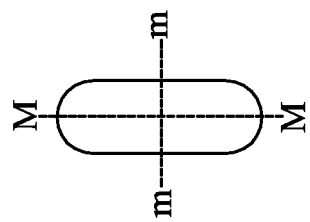
FIGS. 5a-5c illustrate various shapes of bump structures that may be used in various embodiments.
Figure 5B:
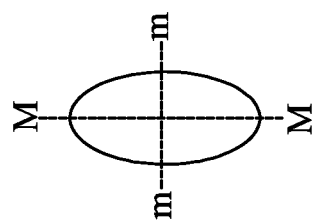
Figure 5A:
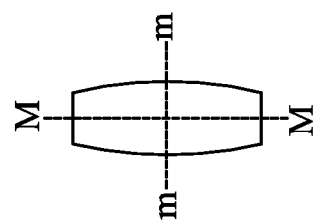
Figure 6A:
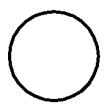
FIGS. 6a-6e illustrate various shapes of openings that may be used in various embodiments.
Figure 6B:
Figure 6C:
Figure 6D:
Figure 6E:
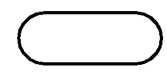

Any suitable process may be used to form the structures discussed above and will not be discussed in greater detail herein. As one of ordinary skill in the art will realize, the above description provides a general description of the features of the embodiment and that numerous other features may be present. For example, other circuitry, liners, barrier layers, under-bump metallization configurations, and the like, may be present. The above description is meant only to provide a context for embodiments discussed herein and is not meant to limit the disclosure or the scope of any claims to those specific embodiments The shapes of the bump structures 108 and the openings 106 discussed above have been provided for illustrative purposes only and may have any suitable shape. For example, FIGS. 5a-5c illustrate various shapes that may be used for the bump structures 108 and FIGS. 6a-6e illustrate various shapes that may be used for the openings 106.

Figure 7A:
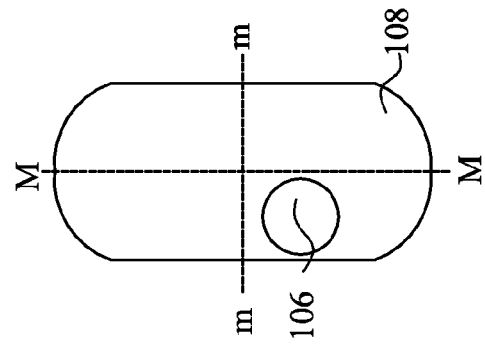
FIGS. 7a-7f illustrate various shapes and placements of the opening under the bump structures in accordance with various embodiments.
Figure 7B:
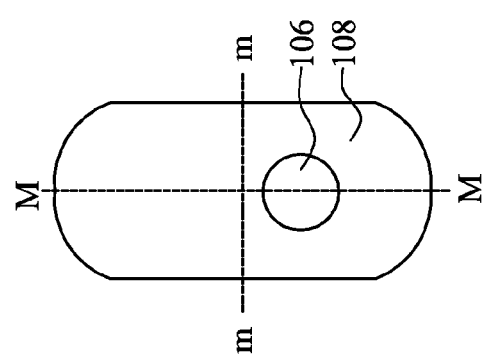
Figure 7C:
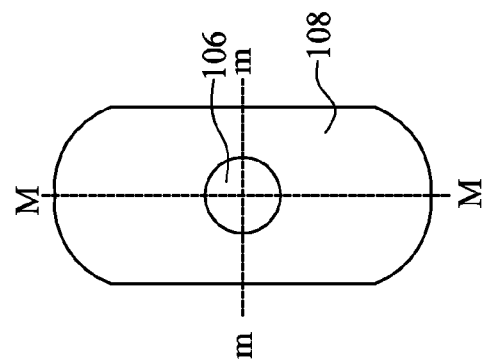
Figure 7D:
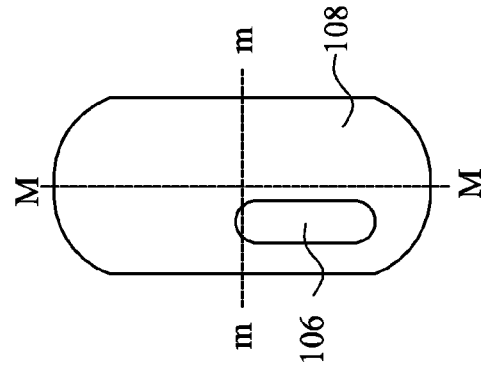
Figure 7E:
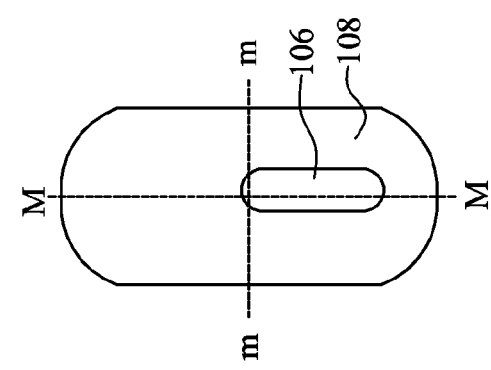
Figure 7F:
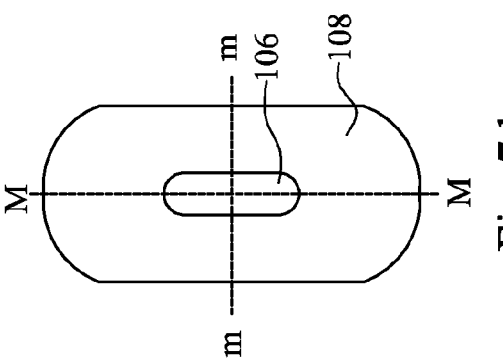

Furthermore, the position of the bump structures 108 relative to the openings 106 may also vary. For example, FIGS. 7a-7f illustrate various shapes and placements of the bump structures 108 and the openings 106 that may be used in various embodiments. As illustrated in FIGS. 7a-7f, the openings 106 may be offset from a major axis M-M of the bump structures 108 as illustrated in FIGS. 7c and 7f, as well as being offset from a minor axis m-m of the bump structures 108 as illustrated in FIGS. 7b, 7c, 7e, and 7f.

In an embodiment, a dielectric layer is formed over a substrate having a conductive pad such that an opening is positioned over at least a portion of the conductive pad. A bump structure is in electrical contact with the conductive pad, wherein a ratio of a distance from an edge of the bump structure to an edge of the opening to a length of the bump structure is greater than or equal to 0.2.

In another embodiment, a dielectric layer overlies a substrate and a conductive pad. An opening in the dielectric layer exposing at least a portion of the conductive pad. A bump structure is formed in electrical contact with the conductive pad. The bump structure has a length L along a longitudinal axis of the bump structure, an outer distance $d_o$ is defined as a distance from an edge of the opening to a first edge of the bump structure in a direction of a chip edge along the longitudinal axis of the bump structure, and a ratio of the outer distance $d_o$ to the length L being greater than or equal to 0.2.

In yet another embodiment, a method of forming a semiconductor device is provided. The method comprises providing a substrate having a conductive pad, the substrate having an uppermost dielectric layer with an opening exposing at least a portion of the conductive pad. A bump structure is formed over the dielectric layer, the bump structure extending into the opening and in electrical contact with the conductive pad. A ratio of a distance from an edge of the bump structure to an edge of the opening to a length of the bump structure is greater than or equal to 0.2.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A semiconductor structure comprising:
   a substrate comprising a conductive pad;
   a dielectric layer over the substrate, the dielectric layer having an opening therein over at least a portion of the conductive pad, the opening being in a corner region of the substrate, the corner region being bounded by adjacent sides of the substrate; and
   a bump structure in electrical contact with the conductive pad, a ratio of a distance from an edge of the bump structure to an edge of the opening to a length of the bump structure being greater than or equal to 0.2, wherein a longitudinal axis of the bump structure is directed toward a center of the substrate, the longitudinal axis being non-parallel to both of the adjacent sides of the substrate.

2. The semiconductor structure of claim 1, wherein the bump structure is elongated.

3. The semiconductor structure of claim 1, wherein the opening is not centered in the bump structure.

4. The semiconductor structure of claim 1, wherein the opening is offset from a major axis of the bump structure.

5. The semiconductor structure of claim 1, wherein the opening is offset from a minor axis of the bump structure.

6. The semiconductor structure of claim 5, wherein the opening is offset away from a nearest chip edge.

7. The semiconductor structure of claim 1, wherein the opening is elongated.

8. A semiconductor structure comprising:
   a substrate comprising a conductive pad;
   a dielectric layer over the substrate, an opening in the dielectric layer exposing at least a portion of the conductive pad; and
   a bump structure in electrical contact with the conductive pad, the bump structure having a length L along a longitudinal axis of the bump structure, an outer distance $d_o$ being defined as a distance from an edge of the opening to a first edge of the bump structure in a direction of a chip edge along the longitudinal axis of the bump structure, a ratio of the outer distance $d_o$ to the length L being greater than or equal to 0.3, the bump structure being in a first corner of the substrate, the longitudinal axis of the bump structure intersecting a longitudinal axis of another bump structure located in a second corner, the first corner and the second corner sharing a common side of the substrate.

9. The semiconductor structure of claim 8, wherein the bump structure is elongated.

10. The semiconductor structure of claim 8, wherein an inner distance $d_i$ is defined as a lateral distance from an edge of the opening to a second edge of the bump structure along the longitudinal axis of the bump structure, the second edge being an opposing edge from the first edge, the inner distance $d_i$ being less than the outer distance $d_o$.

11. The semiconductor structure of claim 8, wherein the opening is offset from a major axis of the bump structure.

12. The semiconductor structure of claim 8, wherein the opening is offset from a minor axis of the bump structure.

13. The semiconductor structure of claim 12, wherein the opening is offset away from a nearest chip edge.

14. The semiconductor structure of claim 8, wherein the opening is elongated.

15. A method of forming a semiconductor device, the method comprising:

providing a substrate having a plurality of conductive pads, the substrate having an uppermost dielectric layer with a plurality of openings, each opening exposing at least a portion of a corresponding one of the plurality of conductive pads; and forming a plurality of bump structures over the dielectric layer, each of the bump structures extending into a corresponding opening and in electrical contact with a corresponding conductive pad, a ratio of a distance from an edge of the bump structure to an edge of the corresponding opening to a length of the bump structure being greater than or equal to 0.2, at least two of the bump structures extending along a same edge of the substrate having longitudinal axis that intersect in a central region of the substrate.

16. The method of claim 15, wherein each bump structure is elongated.

17. The method of claim 16, wherein each bump structure has a minor axis and a major axis, the corresponding opening being offset from the major axis.

18. The method of claim 16, wherein each bump structure has a minor axis and a major axis, the corresponding opening being offset from the minor axis.

19. The method of claim 15, wherein the openings are elongated.

20. The method of claim 15, wherein the forming the plurality of bump structures comprises forming pillar structures and forming solder material on each pillar structure.

* * * * *